US012811356B2

(12) United States Patent
Zhao

(10) Patent No.: US 12,811,356 B2
(45) Date of Patent: Nov. 24, 2026

(54) CONTROLLING A SPECTRAL PROPERTY OF AN OUTPUT LIGHT BEAM PRODUCED BY AN OPTICAL SOURCE

(71) Applicant: Cymer, LLC, San Diego, CA (US)

(72) Inventor: Yingbo Zhao, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 1070 days.

(21) Appl. No.: 17/770,344

(22) PCT Filed: Oct. 16, 2020

(86) PCT No.: PCT/US2020/056117

§ 371 (c)(1),
(2) Date: Apr. 20, 2022

(87) PCT Pub. No.: WO2021/091675

PCT Pub. Date: May 14, 2021

(65) Prior Publication Data

US 2022/0385031 A1 Dec. 1, 2022

Related U.S. Application Data

(60) Provisional application No. 62/932,250, filed on Nov. 7, 2019.

(51) Int. Cl.
*H01S 3/08* (2023.01)
*G03F 7/00* (2006.01)
(Continued)

(52) U.S. Cl.
CPC ...... *H01S 3/08004* (2013.01); *G03F 7/70025* (2013.01); *G03F 7/70041* (2013.01);
(Continued)

(58) Field of Classification Search
CPC .......... H01S 3/134; H01S 3/1305; H01S 3/10; H01S 3/2383; H01S 3/08004;
(Continued)

(56) References Cited

U.S. PATENT DOCUMENTS 6,671,294 B2 12/2003 Kroyan et al.
7,385,697 B2 6/2008 Woollam et al.
(Continued)

FOREIGN PATENT DOCUMENTS

CN 104977820 A 10/2015
CN 109845054 A 6/2019
(Continued)

OTHER PUBLICATIONS

Machine translation of JP-2005142306-A (Year: 2005).*
(Continued)

*Primary Examiner* — Steven H Whitesell
(74) *Attorney, Agent, or Firm* — DiBerardino McGovern IP Group LLC

(57) ABSTRACT

A system includes: an optical source including a plurality of optical oscillators; a spectral analysis apparatus; and a controller. Each optical oscillator is configured to produce a light beam. The controller is configured to: determine, based on data from the spectral analysis apparatus, whether the spectral property of the light beam of one of the optical oscillators is different than the spectral property of the light beam of at least another of the plurality of optical oscillators. If the spectral property of the light beam of the first one of the optical oscillators is different than the spectral property of the light beam of another of the optical oscillators, the controller is configured to adjust the spectral property of the light beam of the first one of the optical oscillators or of the light beam of at least one other of the optical oscillators.

21 Claims, 6 Drawing Sheets

(51) Int. Cl.

| | |
|---|---|
| ***H01S 3/036*** | (2006.01) |
| ***H01S 3/1055*** | (2006.01) |
| ***H01S 3/13*** | (2006.01) |
| ***H01S 3/137*** | (2006.01) |
| ***H01S 3/139*** | (2006.01) |
| ***H01S 3/225*** | (2006.01) |
| ***H01S 3/23*** | (2006.01) |

(52) U.S. Cl.

CPC ........ *G03F 7/7005* (2013.01); *G03F 7/70575* (2013.01); *H01S 3/036* (2013.01); *H01S 3/1055* (2013.01); *H01S 3/1305* (2013.01); *H01S 3/137* (2013.01); *H01S 3/139* (2013.01); *H01S 3/225* (2013.01); *H01S 3/2383* (2013.01); *H01S 3/08009* (2013.01)

(58) Field of Classification Search

CPC ........ H01S 3/036; H01S 3/1055; H01S 3/137; H01S 3/139; H01S 3/225; H01S 3/08009; G03F 7/70041; G03F 7/7005; G03F 7/70025; G03F 7/70575

See application file for complete search history.

(56) References Cited

U.S. PATENT DOCUMENTS

| | | | | |
|---|---|---|---|---|
| 2002/0186739 | A1 | 12/2002 | Sandstrom et al. | |
| 2003/0161373 | A1* | 8/2003 | Kitatochi | G03F 7/70025 372/55 |
| 2003/0219094 | A1 | 11/2003 | Basting et al. | |
| 2006/0114957 | A1* | 6/2006 | Algots | H01S 3/1055 372/55 |
| 2006/0170898 | A1 | 8/2006 | Finders | |
| 2007/0001127 | A1 | 1/2007 | Reiley et al. | |
| 2007/0273852 | A1* | 11/2007 | Arai | G03F 7/70575 355/44 |
| 2008/0181262 | A1 | 7/2008 | Wakabayashi | |
| 2013/0215916 | A1 | 8/2013 | Kakizaki et al. | |
| 2015/0268176 | A1 | 9/2015 | Deng et al. | |
| 2015/0380893 | A1* | 12/2015 | Matsunaga | H01S 3/137 372/20 |
| 2016/0341602 | A1 | 11/2016 | Thornes | |
| 2016/0380402 | A1* | 12/2016 | O'Brien | G03F 7/70 359/342 |
| 2017/0160638 | A1 | 6/2017 | O'Brien et al. | |
| 2018/0109068 | A1 | 4/2018 | Conley | |

FOREIGN PATENT DOCUMENTS

| | | | | |
|---|---|---|---|---|
| JP | H09146136 | A | | 6/1997 |
| JP | H1195272 | A | | 4/1999 |
| JP | 2004524707 | A5 | | 6/2005 |
| JP | 2005142306 | A | * | 6/2005 |
| JP | 2009053597 | A | | 3/2009 |
| JP | 2013062484 | A | | 4/2013 |
| JP | 2018517131 | A | | 6/2018 |
| WO | 2016209669 | A1 | | 12/2016 |
| WO | 2018057089 | A1 | | 3/2018 |

OTHER PUBLICATIONS

Office Action, counterpart Japanese Patent Application No. 2022-522724, mailed Apr. 21, 2023, 9 pages total (including English translation of 5 pages).

Office Action, counterpart Korean Patent Application No. 10-2022-7014114, mailed Aug. 14, 2023, 17 pages total (including English translation of 7 pages).

Denis Hervé, European International Searching Authority, International Search Report and Written Opinion, counterpart PCT Application No. PCT/US2020/056117, mailed Feb. 3, 2021, 12 pages total.

* cited by examiner

CONTROLLING A SPECTRAL PROPERTY OF AN OUTPUT LIGHT BEAM PRODUCED BY AN OPTICAL SOURCE

CROSS REFERENCE TO RELATED APPLICATION

This application claims priority to U.S. Application No. 62/932,250, filed Nov. 7, 2019 and titled CONTROLLING A SPECTRAL PROPERTY OF AN OUTPUT LIGHT BEAM PRODUCED BY AN OPTICAL SOURCE, which is incorporated herein in its entirety by reference.

TECHNICAL FIELD

This disclosure relates to controlling a spectral property of an output light beam produced by an optical source. The optical source includes a plurality of optical oscillators, each of which may produce a deep ultraviolet (DUV) light beam.

BACKGROUND

Photolithography is the process by which semiconductor circuitry is patterned on a substrate such as a silicon wafer. An optical source generates deep ultraviolet (DUV) light used to expose a photoresist on the wafer. DUV light may include wavelengths from, for example, about 100 nanometers (nm) to about 400 nm. Often, the optical source is a laser source (for example, an excimer laser) and the DUV light is a pulsed laser beam. The DUV light from the optical source interacts with a projection optical system, which projects the beam through a mask onto the photoresist on the silicon wafer. In this way, a layer of chip design is patterned onto the photoresist. The photoresist and wafer are subsequently etched and cleaned, and then the photolithography process repeats.

SUMMARY

In one aspect, a system includes: an optical source including a plurality of optical oscillators; a spectral analysis apparatus; and a controller. Each optical oscillator is configured to produce a light beam. The controller is configured to: determine, based on data from the spectral analysis apparatus, whether the spectral property of the light beam of a first one of the optical oscillators is different than the spectral property of the light beam of at least one other of the plurality of optical oscillators; and if the spectral property of the light beam of the first one of the optical oscillators is different than the spectral property of the light beam of at least one other of the optical oscillators, the controller is configured to adjust the spectral property of the light beam of the first one of the optical oscillators or the spectral property of the light beam of at least one other of the optical oscillators.

Implementations may include one or more of the following features.

The spectral property may include a spectral bandwidth. The control system may be configured to determine whether the spectral bandwidth of the light beam of a first one of the optical oscillators is different from the spectral bandwidth of the light beam of at least one other of the optical oscillators by determining whether the spectral bandwidth of the light beam of the first one of the optical oscillators is less than the bandwidth of the at least one other of the plurality of optical oscillators. If the spectral bandwidth of the light beam of the first one of the optical oscillators is less than the spectral bandwidth of the light beam of at least one other of the optical oscillators, the controller may increase the bandwidth of the light beam of the first one of the optical oscillators.

The system also may include a plurality of spectral adjustment apparatuses. Each optical oscillator may be associated with one of the plurality of spectral adjustment apparatuses, and the controller may be configured to control the spectral adjustment apparatus associated with any of the optical oscillators to thereby adjust the spectral property of the light beam of any of the optical oscillators.

Each spectral adjustment system may include at least one optical element, and the controller may be configured to control a particular spectral adjustment apparatus by actuating an actuator coupled to the optical element of that spectral adjustment apparatus such that optical element moves. Moving the optical element may change a center wavelength of the light beam. The controller may be further configured to determine an amount of actuation. To actuate the optical element, the controller may provide an electrical signal to the optical element, the amount of actuation may be based on the electrical signal, and one or more properties of the electrical signal may be determined based on the difference.

The one or more properties of the electrical signal may include an amplitude and/or a frequency. The amount of actuation may be based on a number of light pulses expected to interact with the spectral adjustment system over a period of time, and the amount of actuation may be a number of separate actuations performed over the period of time. The amount of actuation may be based on a difference between the spectral property of the light beam of the first one of the optical oscillators and the spectral property of the light beam of the at least one of the other optical oscillators.

Each spectral adjustment apparatus may include at least one refractive optical element.

Each spectral adjustment apparatus may include at least one prism.

Each spectral adjustment apparatus may include a reflective optical element.

Each spectral adjustment apparatus may include a plurality of prisms and an actuator coupled to one of the prisms, and the controller may be configured to adjust the spectral property of the light beam of any of the optical oscillators by controlling the actuator of the respective spectral adjustment assembly to thereby move the one of the prisms.

Each optical oscillator may be configured to emit a pulsed light beam that includes a plurality of optical pulses.

The controller may be further configured to determine an updated spectral property of the light beam of the first optical oscillator after adjusting the spectral property, and determine whether the updated spectral property of the light beam of the first optical oscillator is different than the spectral property of the light beam of any of the other of the optical oscillators.

The plurality of optical oscillators may include only a first optical oscillator and a second optical oscillator such that the first one of the optical oscillators is the first optical oscillator and the second optical oscillator is the at least one other optical oscillator, and the controller may be configured to: determine, based on data from the spectral analysis system, whether the spectral property of the light beam of first optical oscillator is different than the spectral property of the second optical oscillator; and if the spectral bandwidth of the first optical oscillator is different than the spectral bandwidth of the second optical oscillator, adjust the spectral property of the light beam of the first optical oscillator or the spectral property of the light beam of the second optical oscillator.

The spectral analysis system may include a plurality of spectral analysis systems, and each spectral analysis system may be configured to receive the light beam of one of the optical oscillators, and each spectral analysis system may be configured to measure a spectral property associated with the light beam of the one of the optical oscillators.

Each optical oscillator may be configured to contain a gaseous gain medium. The gaseous gain medium may include krypton fluoride (KrF). If the spectral property of the light beam of the first one of the optical oscillators is different than the spectral property of the light beam of at least one other of the optical oscillators, the controller may be configured to adjust the pressure and/or concentration of one or more gas components of the gaseous gain medium of the first one of the optical oscillators to adjust the spectral property of the light beam of the first one of the optical oscillators, or adjust the pressure and/or concentration of one or more gas components of the gaseous gain medium of at least one other of the optical oscillators to adjust the spectral property of the at least one other of the optical oscillators.

The system may include a beam combiner, the beam combiner configured to: receive the light beam of all of the optical oscillators, and direct the light beams toward a DUV lithography scanner tool.

In some implementations, each optical oscillator is configured to produce a pulsed light beam having a repetition rate, and the controller is configured to adjust the spectral property of the light beam of the first one of the optical oscillators or the second one of the optical oscillators at an adjustment rate, the adjustment rate being equal to or greater than a tenth of the repetition rate.

Another aspect relates to a method for controlling a deep ultraviolet (DUV) light source that includes N optical oscillators, where N is an integer number greater than one and each optical oscillator is configured to produce a respective light beam. The method includes: forming an output light beam based on M light beams produced by M respective optical oscillators, M being an integer number that is greater than zero and is less than or equal to N; accessing data related to a spectral property of each of the M light beams; comparing a spectral property of each of the M light beams to a reference; and determining, based on the comparison, whether to control an aspect of any of the N optical oscillators to thereby adjust the spectral property of any of the N light beams.

Implementations may include one or more of the following features.

The spectral property may include a spectral bandwidth.

The reference may include a spectral property of all of the M light beams such that comparing the spectral property of each of the M light beams to the reference includes comparing the spectral property of each of the M light beams to the spectral property of all of the other M light beams.

Comparing the spectral property of each of the M light beams to the spectral property of all of the other M light beams may include determining a difference between the spectral property of each of the M light beams and the spectral property of each of the other M light beams; and determining, based on the comparison, may include comparing each determined difference to a specification.

The reference may include a pre-determined value of the spectral property, and comparing the spectral property of each of the M light beams to the reference includes comparing the spectral property of each of the M light beams to the pre-determined value. The pre-determined value may include a maximum spectral bandwidth, and the spectral property of each of the M light beams may be compared to the maximum spectral bandwidth by determining a difference between the spectral property of that light beam and the maximum spectral bandwidth. Determining based on the comparison may include comparing the determined differences to a pre-determined acceptable difference range, and, for any of the M light beams having a determined difference that is outside of the pre-determined acceptable difference range, an aspect of the respective optical oscillator may be controlled. Controlling an aspect of the respective optical oscillator may include actuating a dispersive optical element.

The output light beam may be based on the M light beams in a first time period, and based on L light beams in a second time period, L being an integer that is one or greater and is less than or equal to N, and the reference may include a spectral property of each of the L light beams, and comparing the spectral property of each of the M light beams to the reference may include comparing the spectral property of each of the M light beams to the spectral property of each of the L light beams. L may be one, M may be one, N may be two, the L light beam may be a first light beam generated by a first one of the N optical oscillators, and M light beam may be a second light beam generated by a second one of the N optical oscillators; and comparing the spectral property of the first light beam and the spectral property of the second light beam may include determining whether the spectral bandwidth of the second light beam is less than the spectral band width of the first light beam; and if the spectral bandwidth of the second light beam is less than the spectral bandwidth of the first light beam, controlling a prism in the second one of the N optical oscillators such that the spectral bandwidth of the second light beam is increased.

L may be one, M may be one, N may be two, the L light beam may be a first light beam generated by a first one of the N optical oscillators, and M light beam may be a second light beam generated by a second one of the N optical oscillators; and comparing the spectral property of the first light beam and the spectral property of the second light beam may include determining whether the spectral bandwidth of the first light beam is less than the spectral band width of the second light beam; and if the spectral bandwidth of the first light beam is less than the spectral bandwidth of the second light beam, controlling a prism in the first one of the N optical oscillators such that the spectral bandwidth of the first light beam is increased. The method may further include determining an amount of adjustment to the prism in the second one of the N optical oscillators based on a difference between the spectral bandwidth of the first light beam and the spectral bandwidth of the second light beam. To control the prism in the second one of the N optical oscillators, a time-varying signal may be applied to an actuator physically coupled to the prism, the amplitude of the time-varying signal being related to the difference between the spectral bandwidth of the first light beam and the spectral bandwidth of the second light beam.

In another aspect, a control system for a deep ultraviolet (DUV) light source is configured to: control a first set of N optical oscillators to generate a first set of light beams during a first time period such that an output light beam produced by the DUV light source during the first time period includes the first set of light beams; control a second set of the N optical oscillators to generate a second set of light beams during a second time period such that the output light beam produced by the DUV light source during the second time period includes the second set of light beams, the second set of the N optical oscillators and the first set of N optical oscillators do not include the same one or ones of the N optical oscillators; and control a spectral adjustment apparatus of at least one of the N optical oscillators to increase uniformity of a spectral property of the N light beams.

Implementations may include one or more of the following features.

The spectral adjustment apparatus may be controlled before the second time period. The spectral adjustment apparatus of one or more of the N optical oscillators in the second set of the N optical oscillators may be controlled to adjust the spectral property of one or more of the respective second set of light beams.

In some implementations, each optical oscillator is configured to produce a respective pulsed light beam at a repetition rate, and the control system is configured to control the spectral adjustment apparatus of at least one of the N optical oscillators at an adjustment rate that is greater than or equal to a tenth of the repetition rate.

Implementations of any of the techniques described above and herein may include a process, an apparatus, a control system, instructions stored on a non-transient machine-readable computer medium, and/or a method. The details of one or more implementations are set forth in the accompanying drawings and the description below. Other features will be apparent from the description and drawings, and from the claims.

DETAILED DESCRIPTION

Figure 1:
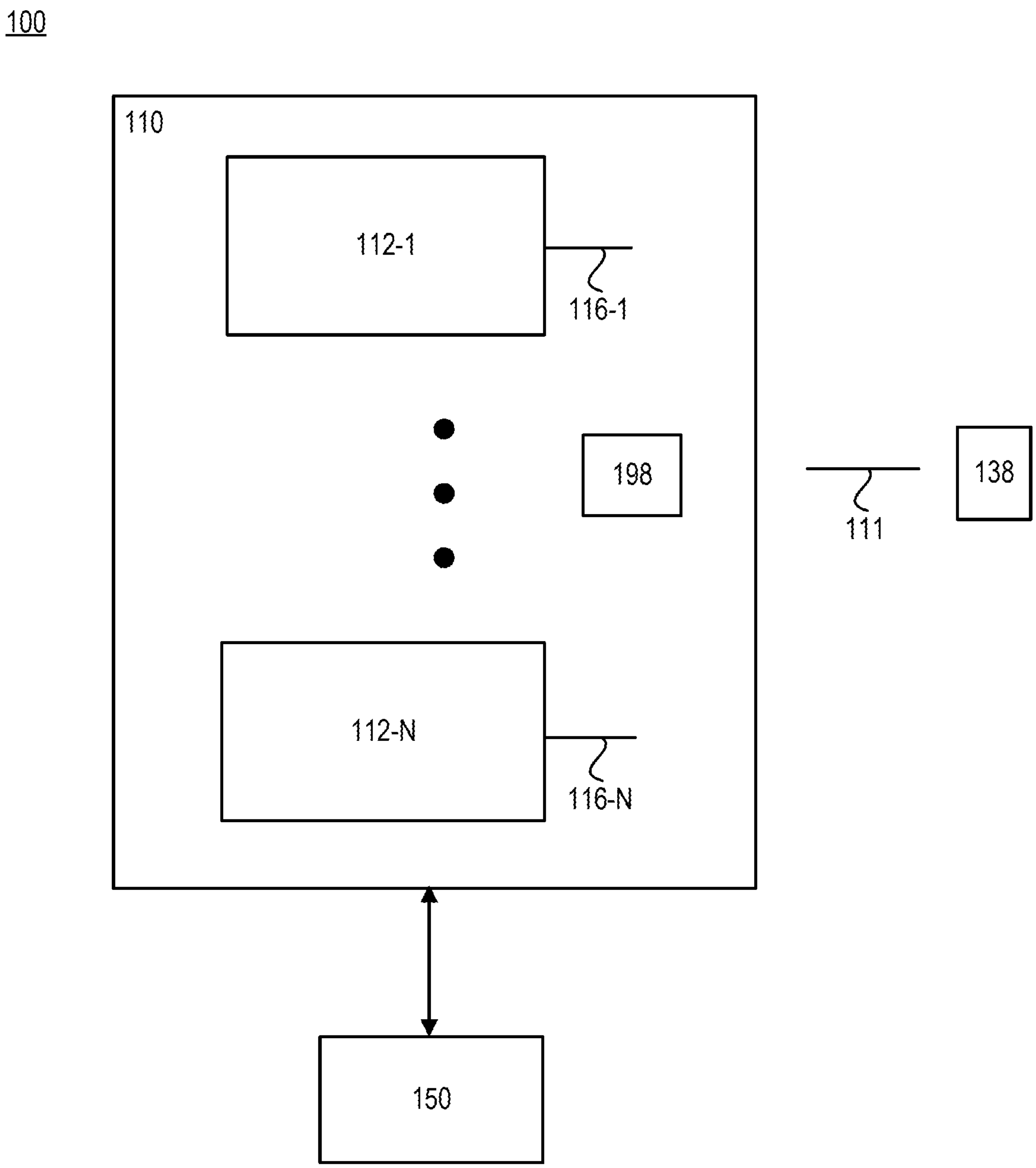
FIG. 1 is a block diagram of an example of an optical source system.

Referring to FIG. 1, a block diagram of a system 100 is shown. The system includes an optical source 110 and a control system 150. The optical source 110 provides an output light beam 111 to a common optical element 138. The common optical element 138 may be, for example, a beam combiner (such as the beam combiner 218 in FIG. 2A) or a lithography tool (such as the scanner apparatus 280 in FIG. 2A).

The optical source 110 includes N optical oscillators 112-1 to 112-N, where N is an integer number greater than one. Each optical oscillator 112-1 to 112-N is configured to produce a respective light beam 116-1 to 116-N. Depending on the needs of the application that uses the system 100, one, more than one, or all of the light beams 116-1 to 116-N may contribute to the output light beam 111 at any given time. The one or ones of the light beams 116-1 to 116-N that contribute to the output light beam 111 vary over time. For example, in some implementations, the control system 150 controls the optical source 110 to cycle through the optical oscillators 112-1 to 112-N such that only one of the optical oscillators 112-1 to 112-N contributes its respective light beam 116-1 to 116-N to the output light beam 111 at a particular time.

The optical source 110 also includes a spectral analysis apparatus 198, which is configured to sense light and to produce data related to a spectral property of the sensed light. The spectral property may be, for example, a spectral bandwidth or a center wavelength. The spectral analysis apparatus 198 is configured to sense any of the light beams 116-1 to 116-N. The spectral analysis apparatus 198 is shown as a single element in the example of FIG. 1. However, in some implementations, the optical source 110 includes N spectral analysis apparatus, and each one of the optical oscillators 112-1 to 112-N has an associated spectral analysis apparatus (such as in the implementation in FIG. 2A).

Due to differences in components, operation, and/or construction of the optical oscillators 112-1 to 112-N, one or more spectral properties (for example, spectral bandwidth) may differ among the various light beams 116-1 to 116-N. Because the one or ones of the light beams 116-1 to 116-N that contribute to the output light beam 111 changes over time, the spectral characteristics of the output light beam 111 may change when the control system 150 switches from generating the output light beam 111 with a certain one or ones of the optical oscillators 112-1 to 112-N to generating the output light beam 111 with another one or other ones of the optical oscillators 112-1 to 112-N.

On the other hand, the control system 150 analyzes data from the spectral analysis apparatus 198 and controls one or more of the optical oscillators 112-1 to 112-N to control the spectral properties of the respective light beams 116-1 to 116-N. Thus, the control system 150 may reduce or eliminate discrepancies in the spectral properties of the various light beams 116-1 to 116-N. In this way, the spectral characteristics of the spectral property of the output light beam 111 received at the common optical element 138 over time is made more uniform or consistent even though the one or ones of the optical oscillators 112-1 to 112-N that produce light that contributes to the output light beam 111 change over time. The control system 150 also may be used to perform other adjustments to the optical source 110. For example, in some implementations, the control system 150 controls or adjusts an optical element or other component in any of the optical oscillators 112-1 to 112-N that are producing a light beam that has a spectral property that does not meet a specification.

Figures 2A, 2B:
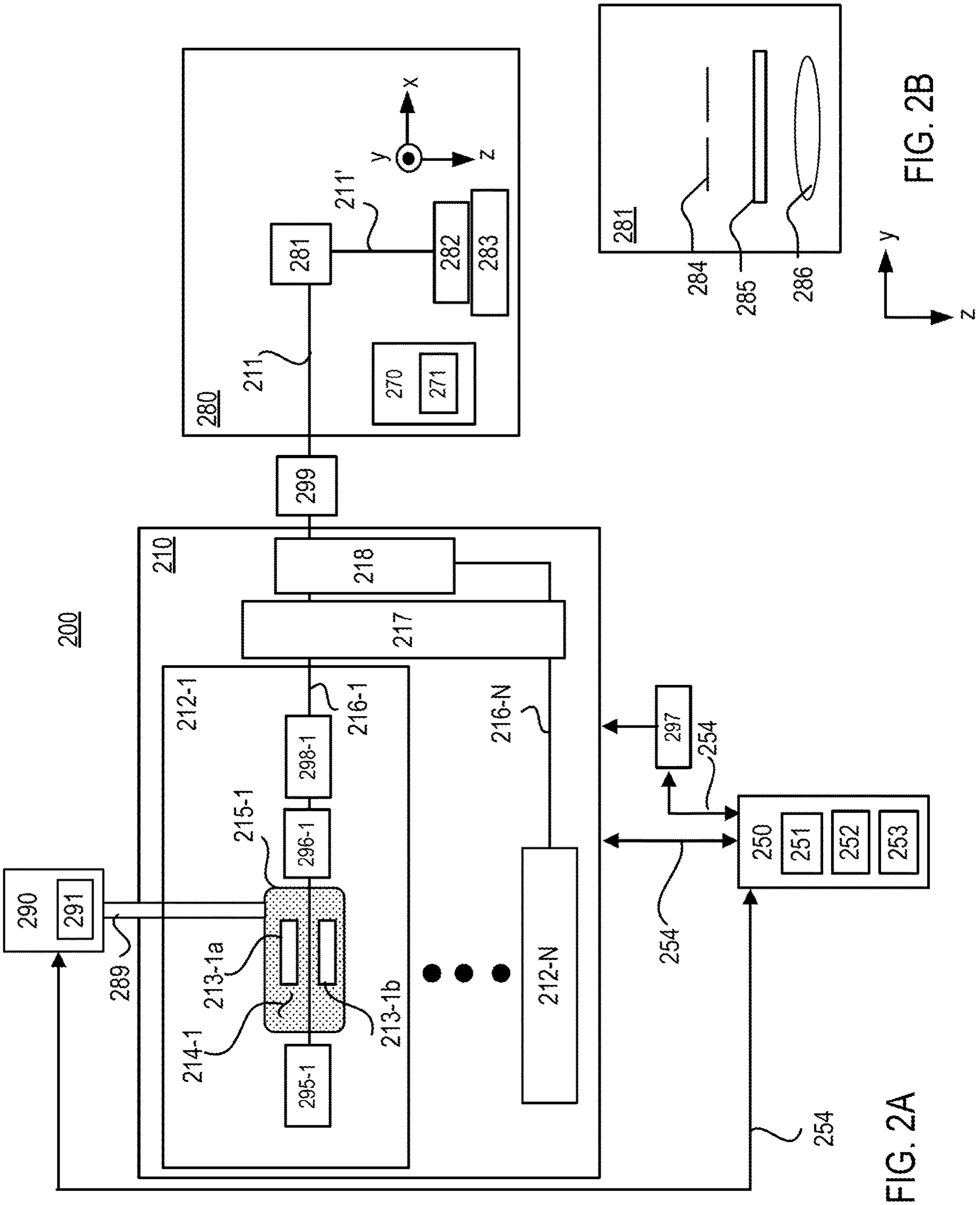
FIG. 2A is a block diagram of another example of an optical source system.
FIG. 2B is an example of a projection optical system within a scanner apparatus that receives and output of the optical source system of FIG. 2A.

Prior to discussing various implementations and examples of the control system 150 in greater detail, an overview of one possible implementation of the optical source 210 is provided with respect to FIGS. 2A and 2B.

Referring to FIGS. 2A and 2B, a system 200 includes an optical source 210 that provides an exposure beam (or output light beam) 211 to a scanner apparatus 280. A control system 250 is coupled to the optical source 210 and various components associated with the optical source 210. The data link 254 is any type of wireless and/or wired medium that carries data and information as, for example, electrical or optical signals. The optical source 210 and the control system 250 are implementations of the optical source 110 and control system 150, respectively (FIG. 1).

The optical source 210 includes optical oscillators 212-1 to 212-N, where N is an integer number that is greater than one. Each optical oscillator 212-1 to 212-N generates a respective light beam 216-1 to 216-N. The details of the optical oscillator 212-1 are discussed below. The other N−1 optical oscillators in the optical source 210 include the same or similar features.

The optical oscillator 212-1 includes a discharge chamber 215-1, which encloses a cathode 213-1*a* and an anode 213-1*b*. The discharge chamber 215-1 also contains a gaseous gain medium 214-1. A potential difference between the cathode 213-1*a* and the anode 213-1*b* forms an electric field in the gaseous gain medium 214-1. The potential difference may be generated by controlling a voltage source 297 to apply voltage to the cathode 213-1*a* and/or the anode 213-1*b*. The electric field provides energy to the gain medium 214-1 sufficient to cause a population inversion and to enable generation of a pulse of light via stimulated emission. Repeated creation of such a potential difference forms a train of pulses, which are emitted as the light beam 216-1. The repetition rate of the pulsed light beam 216-1 is determined by the rate at which voltage is applied to the electrodes 213-1*a* and 213-1*b*.

The gain medium 214-1 is pumped by applying of a voltage to the electrodes 213-1*a* and 213-1*b*. The duration and repetition rate of the pulses in the pulsed light beam 216-1 is determined by the duration and repetition rate of the application of the voltage to the electrodes 213-1*a* and 213-1*b*. The repetition rate of the pulses may range, for example, between about 500 and 6,000 Hz. In some implementations, the repetition rate may be greater than 6,000 Hz, and may be, for example, 12,000 Hz or greater. Each pulse emitted from the optical oscillator 212-1 may have a pulse energy of, for example, approximately 1 milliJoule (mJ).

The gaseous gain medium 214-1 may be any gas suitable for producing a light beam at the wavelength, energy, and bandwidth required for the application. The gaseous gain medium 214-1 may include more than one type of gas, and the various gases are referred to as gas components. For an excimer source, the gaseous gain medium 214-1 may contain a noble gas (rare gas) such as, for example, argon or krypton; or a halogen, such as, for example, fluorine or chlorine. In implementations in which a halogen is the gain medium, the gain medium also includes traces of xenon apart from a buffer gas, such as helium.

The gaseous gain medium 214-1 may be a gain medium that emits light in the deep ultraviolet (DUV) range. DUV light may include wavelengths from, for example, about 100 nanometers (nm) to about 400 nm. Specific examples of the gaseous gain medium 214-1 include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm.

A resonator is formed between a spectral adjustment apparatus 295-1 on one side of the discharge chamber 215-1 and an output coupler 296-1 on a second side of the discharge chamber 215-1. The spectral adjustment apparatus 295-1 may include a diffractive optic such as, for example, a grating and/or a prism, that finely tunes the spectral output of the discharge chamber 215-1. The diffractive optic may be reflective or refractive. In some implementations, the spectral adjustment apparatus 295-1 includes a plurality of diffractive optical elements. For example, the spectral adjustment apparatus 295-1 may include four prisms, some of which are configured to control a center wavelength of the light beam 216-1 and others of which are configured to control a spectral bandwidth of the light beam 216-1.

Figure 3A:
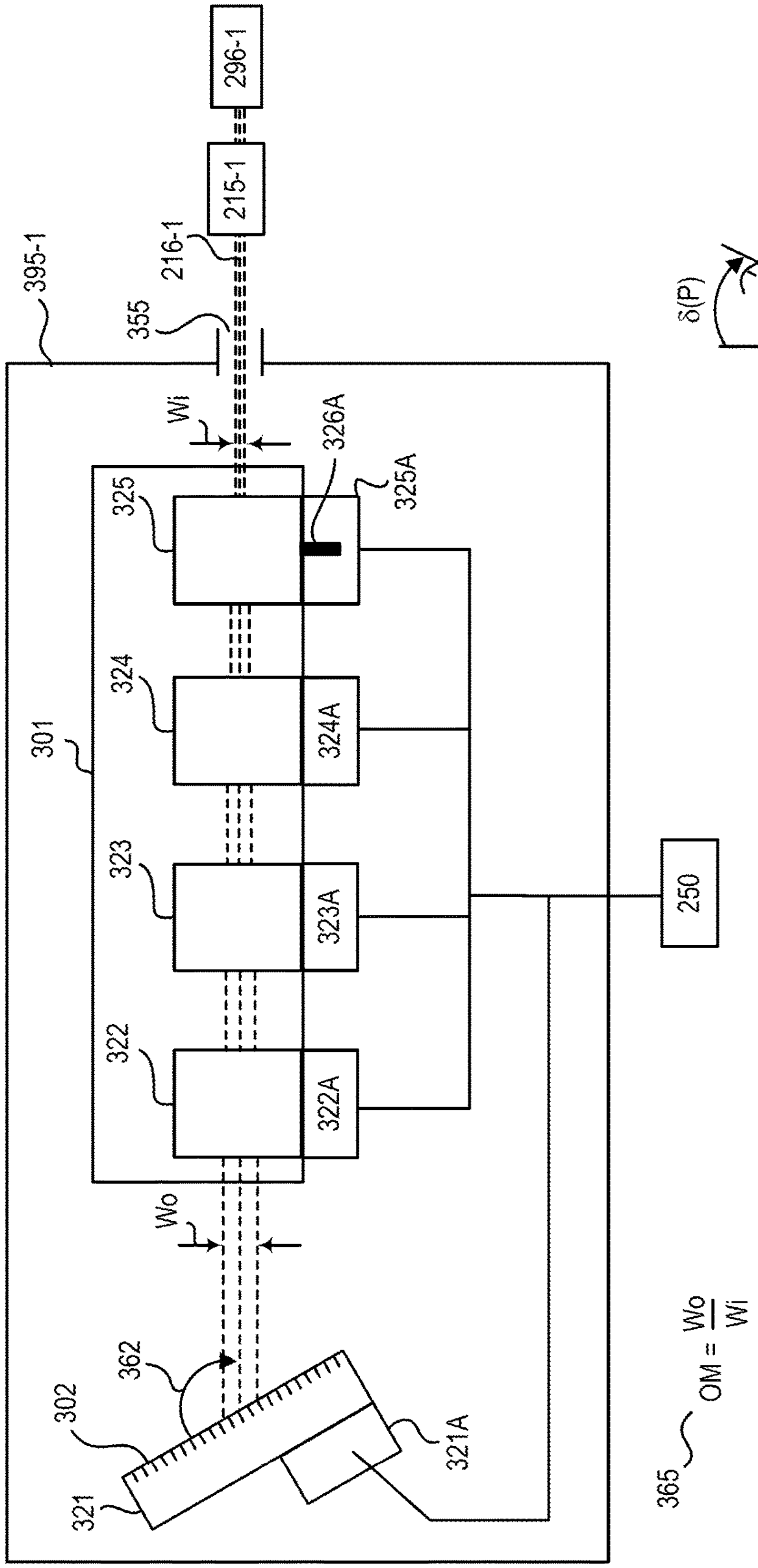
FIG. 3A is a block diagram of an example of a spectral analysis apparatus.

Referring also to FIG. 3A, a block diagram of a spectral adjustment apparatus 395-1 is shown. The spectral adjustment apparatus 395-1 may be used as any or each of the spectral adjustment apparatuses 295-1 to 295-N. The spectral adjustment apparatus 395-1 includes a set of optical features or components 321, 322, 323, 324, 325 arranged to optically interact with the light beam 216-1. The control system 250 is connected to one or more actuation systems 321A, 322A, 323A, 324A, 325A that are physically coupled to respective optical components 321, 322, 323, 324, 325. The actuation systems 321A, 322A, 323A, 324A, 325A may include shafts (such as a shaft 326A) that rotate a component coupled to the shaft about an axis parallel to the shaft. The actuation systems 321A, 322A, 323A, 324A, 325A also include electronics and mechanical devices such as, for example, motors and electronic interfaces for communicating with the control system 250 and for receiving electrical power.

The optical component 321 is a dispersive optical element, for example, a grating or a prism. In the example of FIG. 3A, the optical component 321 is a reflective grating that includes a diffractive surface 302. The optical components 322, 323, 324, and 325 are refractive optical elements and may be, for example, prisms. The optical components 322, 323, 324, and 325 form a beam expander 301 that has an optical magnification OM 365. The OM 365 of the light beam 216-1 through the beam expander 301 is the ratio of the transverse width Wo of the light beam 216-1 exiting the beam expander 301 to a transverse width Wi of the light beam 216-1 entering the beam expander 301.

The surface 302 of the grating 321 is made of a material that reflects and diffracts the wavelengths of the light beam 216-1. Each of the prisms 322, 323, 324, and 325 is a prism that acts to disperse and redirect the light beam 216-1 as it passes through the body of the prism. Each of the prisms 322, 323, 324, and 325 is made of a material that transmits the wavelengths in the light beam 216-1. For example, if the light beam 216-1 is in the DUV range, the prisms 322, 323, 324, and 325 are made of a material (such as, for example, calcium fluoride) that transmits light in the DUV range.

The prism 325 is positioned farthest from the grating 321, and the prism 322 is positioned closest to the grating 321. The light beam 216-1 enters the spectral adjustment apparatus through an aperture 355, and then travels through the prism 325, the prism 324, the prism 323, and the prism 322 (in that order). With each passing of the light beam 216-1 through a consecutive prism 325, 324, 323, 322, the light beam 216-1 is optically magnified and redirected (refracted at an angle) toward the next optical component. After passing through the prisms 325, 324, 323, and 322, the light beam 216-1 reflects off the surface 302. The light beam 216-1 then passes through the prism 322, the prism 323, the prism 324, and the prism 325 (in that order). With each passing through the consecutive prisms 322, 323, 324, 325, the light beam 216-1 is optically compressed as it travels toward the aperture 355. After passing through the prisms 322, 323, 324, and 325, the light beam 216-1 exits the spectral adjustment apparatus 395-1 through the aperture 355. After exiting the spectral adjustment apparatus 395-1, the light beam 216-1 passes through the chamber 215-1 and reflects off of the output coupler 296-1 to return to the chamber 215-1 and the spectral adjustment apparatus 395-1.

Figure 3B:
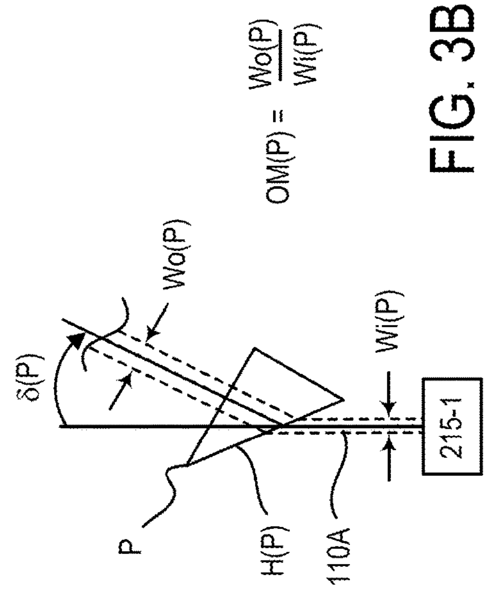
FIG. 3B is an example of the rotation of a prism about an axis to change an angle of incidence of a light beam in a spectral analysis apparatus.

The spectral property of the light beam 216-1 may be adjusted by changing the relative orientations of the optical components 321, 322, 323, 324, and/or 325. Referring to FIG. 3B, the rotation of a prism P (which can be any one of prisms 322, 323, 324, or 325) about an axis that is perpendicular to the plane of the page changes an angle of incidence at which the light beam 216-1 impinges upon the entrance surface H(P) of that rotated prism P. Moreover, two local optical qualities, namely, an optical magnification OM(P) and a beam refraction angle δ(P), of the light beam 216-1 through that rotated prism P are functions of the angle of incidence of the light beam 216-1 impinging upon the entrance surface H(P) of that rotated prism P. The optical magnification OM(P) of the light beam 216-1 through the prism P is the ratio of a transverse width Wo(P) of the light beam 110A exiting that prism P to a transverse width Wi(P) of the light beam 216-1 entering that prism P.

A change in the local optical magnification OM(P) of the light beam 216-1 at one or more of the prisms P within the beam expander 301 causes an overall change in the optical magnification OM 365 of the light beam 216-1 through the beam expander 301. Additionally, a change in the local beam refraction angle δ(P) through one or more of the prisms P within the beam expander 301 causes an overall change in an angle of incidence 362 (FIG. 3A) of the light beam 110A at the surface 302 of the grating 321. The wavelength of the light beam 216-1 may be adjusted by changing the angle of incidence 362 (FIG. 3A) at which the light beam 216-1 impinges upon the surface 302 of the grating 321. The spectral bandwidth of the light beam 216-1 may be adjusted by changing the optical magnification 365 of the light beam 216-1.

Accordingly, the spectral properties of the light beam 216-1 may be changed or adjusted by controlling the orientation of the grating 321 and/or one or more of the prisms 322, 323, 324, 325 via the respective actuators 321A, 322A, 323A, 324A, 325A. Other implementations of the spectral adjustment apparatus are possible.

Moreover, the spectral properties of the light beams 216-1 to 216-N may be adjusted in other ways. For example, the spectral properties, such as the spectral bandwidth, of the light beams 216-1 to 216-N may be adjusted by controlling a pressure and/or gas concentration of the gaseous gain medium of the respective chamber 215-1 to 215-N. For implementations in which the source 210 is an excimer source, the spectral properties (for example, the spectral bandwidth) of the light beams 216-1 to 216-N may be adjusted by controlling the pressure and/or concentration of, for example, fluorine, chlorine, argon, krypton, xenon, and/or helium in the respective chamber 215-1 to 215-N. The pressure and/or concentration of the gaseous gain medium 214-1 to 214-N is controllable with the gas supply system 290.

Referring again to FIG. 2A, the optical oscillator 212-1 also includes a spectral analysis apparatus 298-1. The spectral analysis apparatus 298-1 is a measurement system that may be used to measure or monitor the wavelength of the light beam 216-1. In the example shown in FIG. 2, the spectral analysis apparatus 298-1 receives light from the output coupler 296-1. Other implementations are possible. For example, the spectral analysis apparatus 298-1 may be between the output coupler 296-1 and the spectral adjustment apparatus 295-1 or may be positioned in the scanner apparatus 280.

Figure 2C:
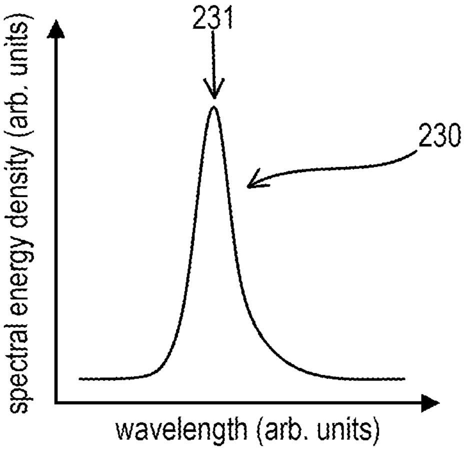
FIG. 2C is an example of spectral bandwidth expressed as energy density as a function of wavelength.

The spectral analysis apparatus 298-1 provides data to the control system 250, and the control system 250 determines metrics related to the spectral characteristics of the light beam 216-1 based on the data from the spectral analysis apparatus 298-1. For example, the control system 250 may determine a center wavelength and/or a spectral bandwidth based on the data measured by the spectral analysis apparatus 298-1. The spectral property may be measured by the apparatus 298-1 directly or may be determined by the control system 250 based on data from the spectral analysis apparatus 298-1. The center wavelength is the power-weighted average wavelength of the light beam. Spectral bandwidth is a measure of the spread or distribution of wavelengths in a light beam. FIG. 2C shows an example of spectral bandwidth 230 expressed as energy density as a function of wavelength, with the center wavelength labeled as 231. The spectral bandwidth may be characterized by a quantity such as the full-width at half max (FWHM) or the 95% integral width (E95). The FWHM is the spectral range encompassed at half of the maximum intensity. E95 is the interval that encloses 95% of the total energy in the spectrum.

Referring again to FIG. 2A, the optical source 210 also includes a gas supply system 290 that is fluidly coupled to an interior of the discharge chamber 215-1 via a fluid conduit 289. The fluid conduit 289 is any conduit that is capable of transporting a gas or other fluid with no or minimal loss of the fluid. For example, the fluid conduit 289 may be a pipe that is made of or coated with a material that does not react with the fluid or fluids transported in the fluid conduit 289. The gas supply system 290 includes a chamber 291 that contains and/or is configured to receive a supply of the gas or gasses used in the gain medium 214-1. The gas supply system 290 also includes devices (such as pumps, valves, and/or fluid switches) that enable the gas supply system 290 to remove gas from or inject gas into the discharge chamber 215-1. The gas supply system 290 is coupled to the control system 250. The gas supply system 290 may be controlled by the control system 250 to perform, for example, a refill procedure.

The other N−1 optical oscillators are similar to the optical oscillator 212-1 and have similar or the same components and subsystems. For example, each of the optical oscillators 212-1 to 212-N includes electrodes like the electrodes 213-1*a* and 213-1*b*, a spectral analysis apparatus like the spectral analysis apparatus 298-1, and an output coupler like the output coupler 296-1. Moreover, the voltage source 297 may be electrically connected to the electrodes in each of the optical oscillators 212-1 to 212-N, or the voltage source 297 may be implemented as a voltage system that includes N individual voltage sources, each of which is electrically connected to the electrodes of one of the optical oscillators 212-1 to 212-N.

The optical source 210 also includes a beam control apparatus 217 and a beam combiner 218. The beam control apparatus 217 is between the gaseous gain media of the optical oscillators 212-1 to 212-N and the beam combiner 218. The beam control apparatus 217 determines which of the light beams 216-1 to 216-N are incident on the beam combiner 218. The beam combiner 218 forms the exposure beam 211 from the light beam or light beams that are incident on the beam combiner 218. For example, the beam combiner 218 may redirect all the light beams that are incident upon it toward the scanner apparatus 280.

In the example shown, the beam control apparatus 217 is represented as a single element. However, the beam control apparatus 217 may be implemented as a collection of individual beam control apparatuses. For example, the beam control apparatus 217 may include a collection of N shutters, with one shutter being associated with each of the optical oscillators 212-1 to 212-N. Each of the N shutters may be a mechanical shutter or an electro-optical shutter. Each of the N shutters has a first state that blocks the respective light beam 216-1 to 216-N and a second set that transmits the respective light beam 216-1 to 216-N.

The optical source 210 may include other components and systems. For example, the optical source 210 may include a beam preparation system 299. The beam preparation system 299 may include a pulse stretcher (not shown) that stretches each pulse that interacts with the pulse stretcher in time. The beam preparation system also may include other components that are able to act upon light such as, for example, reflective and/or refractive optical elements (such as, for example, lenses and mirrors), and/or filters. In the example shown, the beam preparation system 299 is positioned in the path of the exposure beam 211. However, the beam preparation system 299 may be placed at other locations within the optical lithography system 200. Moreover, other implementations are possible. For example, the optical source 210 may include N instances of the beam preparation system 299, each of which is placed between the beam combiner 218 and one of the chambers 215-1 to 215-N and positioned to interact with one of the light beams 216-1 to 216-N. In another example, the optical source 210 may include optical elements (such as mirrors) that steer the light beams 216-1 to 216-N toward the beam combiner 218.

The system 200 also includes the scanner apparatus 280. The scanner apparatus 280 exposes a wafer 282 with a shaped exposure beam 211'. The shaped exposure beam 211' is formed by passing the exposure beam 211 through a projection optical system 281. The scanner apparatus 280 may be a liquid immersion system or a dry system. The scanner apparatus 280 includes a projection optical system 281 through which the exposure beam 211 passes prior to reaching the wafer 282, and a sensor system or metrology system 270. The wafer 282 is held or received on a wafer holder 283. The scanner apparatus 280 also may include, for example, temperature control devices (such as air conditioning devices and/or heating devices), and/or power supplies for the various electrical components.

The metrology system 270 includes a sensor 271. The sensor 271 may be configured to measure a property of the shaped exposure beam 211' such as, for example, bandwidth, energy, pulse duration, and/or wavelength. The sensor 271 may be, for example, a camera or other device that is able to capture an image of the shaped exposure beam 211' at the wafer 282, or an energy detector that is able to capture data that describes the amount of optical energy at the wafer 282 in the x-y plane.

In the implementation shown in FIG. 2A, the metrology system 270 is not coupled to the control system 250. However, in other implementations, the metrology system 270 is coupled to the control system 250. In these implementations, the metrology system 270 provides data to the control system 250, and the control system 250 may issue commands to the metrology system 270.

The control system 250 includes an electronic processing module 251, an electronic storage 252, and an I/O interface 253. The electronic processing module 251 includes one or more processors suitable for the execution of a computer program such as a general or special purpose microprocessor, and any one or more processors of any kind of digital computer. Generally, an electronic processor receives instructions and data from a read-only memory, a random access memory (RAM), or both. The electronic processing module 251 may include any type of electronic processor. The electronic processor or processors of the electronic processing module 251 execute instructions and access data stored on the electronic storage 252. The electronic processor or processors are also capable of writing data to the electronic storage 252.

The electronic storage 252 may be volatile memory, such as RAM, or non-volatile memory. In some implementations, and the electronic storage 252 includes non-volatile and volatile portions or components. The electronic storage 252 may store data and information that is used in the operation of the control system 250. For example, the electronic storage 252 may store specification information for the light beams 216-1 to 216-N. The specification information may include, for example, target energy, wavelength, and/or spectral bandwidth for the light beams 216-1 to 216-N. The specification information also may include a range or an upper limit on an acceptable amount of difference in the spectral property of the light beams 216-1 to 216-N. The electronic storage 252 also may store instructions (for example, in the form of a computer program) for controlling the spectral adjustment apparatuses 295-1 to 295-N and for analyzing data from the spectral analysis apparatuses 298-1 to 298-N.

The electronic storage 252 also may store instructions (for example, in the form of a computer program) that cause the control system 250 to interact with other components and subsystems in the optical lithography system 200. For example, the instructions may be instructions that cause the electronic processing module 251 to provide a command signal to the optical source 210 and/or to the beam control apparatus 217 to change the one or ones of the optical oscillators 212-1 to 212-N contributing to the exposure beam 211. The electronic storage 252 also may store information received from the optical lithography system 200, the scanner apparatus 280, and/or the optical source 210.

The I/O interface 253 is any kind of interface that allows the control system 250 to exchange data and signals with an operator, the optical source 210, the scanner apparatus 280, and/or an automated process running on another electronic device. For example, in implementations in which rules or instructions stored on the electronic storage 252 may be edited, the edits may be made through the I/O interface 253. The I/O interface 253 may include one or more of a visual display, a keyboard, and a communications interface, such as a parallel port, a Universal Serial Bus (USB) connection, and/or any type of network interface, such as, for example, Ethernet. The I/O interface 253 also may allow communication without physical contact through, for example, an IEEE 802.11, Bluetooth, or a near-field communication (NFC) connection.

The control system 250 is coupled to the optical source 210 through the data connection 254. The data connection 254 may be a physical cable or other physical data conduit (such as a cable that supports transmission of data based IEEE 802.3), a wireless data connection (such as a data connection that provides data via IEEE 802.11 or Bluetooth), or a combination of wired and wireless data connections. The data that is provided over the data connection may be set through any type of protocol or format. The data connection 254 is connected to the optical source 210 at a communication interface. The communication interfaces may be any kind of interface capable of sending and receiving data. For example, the data interfaces may be any of an Ethernet interface, a serial port, a parallel port, or a USB connection. In some implementations, the data interfaces allow data communication through a wireless data connection. For example, the data interfaces may be an IEEE 811.11 transceiver, Bluetooth, or an NFC connection. The control system 250 may be connected to systems and/or components within the optical source 210. For example, the control system 250 may be directly connected to each of the optical oscillators 212-1 to 212-N.

Referring also to FIG. 2B, the projection optical system 281 includes a slit 284, a mask 285, and a projection objective, which includes a lens system 286. The lens system 286 includes one or more optical elements. The exposure beam 211 enters the scanner apparatus 280 and impinges on the slit 284, and at least some of the output light beam 211 passes through the slit 284 to form the shaped exposure beam 211'. In the example of FIGS. 2A and 2B, the slit 284 is rectangular and shapes the exposure beam 211 into an elongated rectangular shaped light beam, which is the shaped exposure beam 211'. The mask 285 includes a pattern that determines which portions of the shaped light beam are transmitted by the mask 285 and which are blocked by the mask 285. Microelectronic features are formed on the wafer 282 by exposing a layer of radiation-sensitive photoresist material on the wafer 282 with the exposure beam 211'. The design of the pattern on the mask is determined by the specific microelectronic circuit features that are desired.

The control system 250 controls one or more aspects of the optical oscillators 212-1 to 212-N to control the spectral property or properties of the respective light beams 216-1 to 216-N. The control system 250 may adjust the light beams 216-1 to 216-N to have substantially the same spectral properties. For example, the control system 250 may determine, based on information from the spectral analysis apparatuses 298-1 to 298-N that the spectral bandwidth of the light beam 216-1 is less than the spectral bandwidth of the other N−1 light beams. In response, the control system 250 controls the spectral adjustment apparatus 295-1 or characteristics of the gain medium 214-1 to increase the spectral bandwidth of the light beam 216-1.

Figure 4:
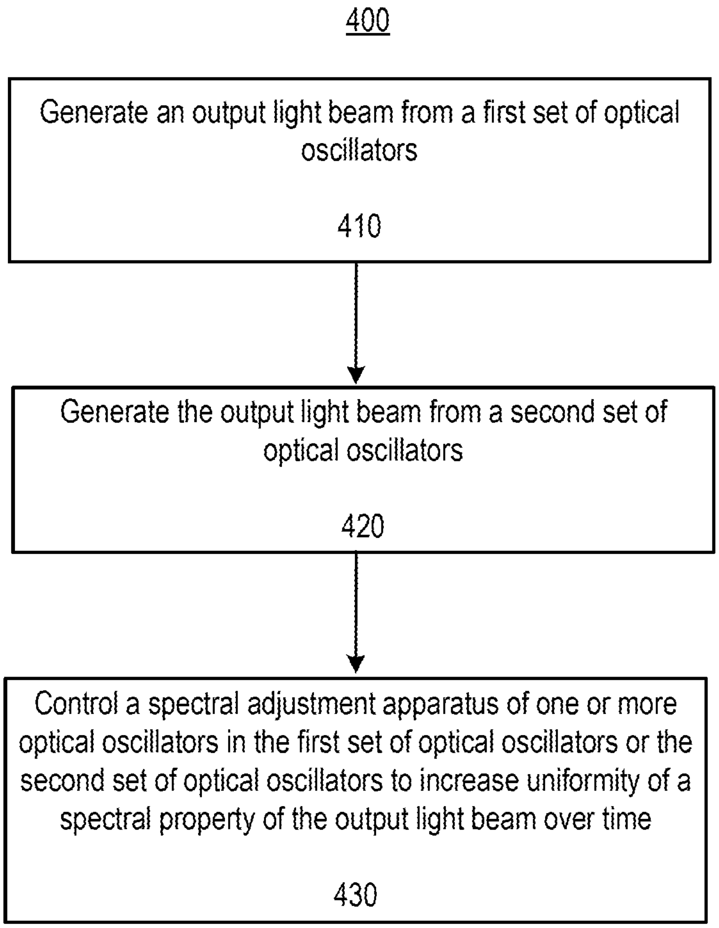
FIG. 4 is a flow chart of an example of a process for increasing the uniformity of a spectral property of an output light beam in an optical source system.

Referring to FIG. 4, a flow chart of a procedure 400 is shown. The procedure 400 may be performed by the control system 150 (FIG. 1) or the control system 250 (FIG. 2A). In the example below, the procedure 400 is performed by the control system 250 and by the optical source 210. As discussed above, the optical system 210 includes N optical oscillators 212-1 to 212-N, each of which is configured to produce a respective light beam 216-1 to 216-N. At least one of the light beams 216-1 to 216-N contributes to the output light beam 211 at any given time.

Including more than one optical oscillator in the optical source 210 improves the performance of the optical source 210 and the system 200. For example, optical oscillators are typically taken out of service for maintenance after a service interval has passed. The service interval may be a time period or a pre-defined number of pulses. An optical oscillator cannot reliably produce the respective light beam while maintenance is being performed. Because the optical source 210 includes more than one optical oscillator, one of the optical oscillators may be serviced while the other one or ones of the optical oscillators are being maintained. Thus, by including the N optical oscillators, downtime of the source 210 (and the system 200) is reduced. Furthermore, the total time period in which the source 210 operates without requiring that any of the optical oscillators are replaced is greater than the amount of time in which an optical source that includes only one set of optical oscillators can operate.

Thus, the N optical oscillators results in the source 210 having less downtime and a longer overall operating lifetime. The one or ones of the light beams 216-1 to 216-N that contribute to the output light beam 211 change over time. Without correction, each of the light beams 216-1 to 216-N may have different values or quantities for the same spectral property. Thus, in the absence of correction, the spectral property of the output light beam 211 also could change over time as light beams from a different one or ones of the optical oscillators 212-1 to 212-N are used to generate the output light beam 211. The procedure 400 is performed to increase the uniformity of a spectral property of the output light beam 211 over time.

During a first time period, the optical lithography system 200 generates the output light beam 211 from a first set of the N optical oscillators 212-1 to 212-N (410). The first time period may be the time that it takes for each of the optical oscillators in the first set to produce a certain number of pulses, for example, thousands of pulses, or the first time period may be a pre-set time period. The first set may include one of the N optical oscillators 212-1 to 212-N, a plurality of the N optical oscillators, or all of the N optical oscillators. The control system 250 controls the optical system 210 such that only light beams from the first set of oscillators contribute to the output light beam 211.

For example, in some implementations, all of the optical oscillators 212-1 to 212-N produce a respective light beam 216-1 to 216-N, and the control system 250 acts on the beam control apparatus 217 to ensure that only light beams produced by optical oscillators in the first set contribute to the output light beam 211. In this implementation, the control system 250 acts on the beam control apparatus 217 such that only light beams generated by an optical oscillator in the first set contribute to the output light beam 211. For example, the beam control apparatus 217 may include N shutters, each of which is associated with one of the N optical oscillators 212-1 to 212-N. In a first state, each shutter blocks the respective light beam. In a second state, each shutter transmits a respective light beam. In these implementations, the control system 250 controls the shutter associated with each optical oscillator in the first set to be in the second state. The control system 250 places the shutter associated with each optical oscillator that is not in the first set of optical oscillators in the first state. Thus, light beams generated by optical oscillators not in the first set do not reach the beam combiner 218 and do not contribute to the output light beam 211.

In other implementations, the control system 250 causes only those optical oscillators that are in the first set to generate respective light beams while the optical oscillators that are not in the first set are in an OFF state in which they do not produce a light beam. In these implementations, light beams from the optical oscillators in the first set reach the beam combiner 218. Light beams from the optical oscillators that are not in the first set do not reach the beam combiner 218. Thus, during the first time period, the output light beam 211 only includes contributions from light beams produced by optical oscillators in the first set.

During the second time period, the optical lithography system 200 generates the output light beam 211 from a second set of the N optical oscillators 212-1 to 212-N (420). The second time period occurs after the first time period. The second time period may be the time that it takes for each of the optical oscillators in the second set to produce a certain number of pulses, for example, thousands of pulses, or a pre-set time period. The first and second time periods may be the same or different.

The second set of optical oscillators may include one optical oscillator, a plurality of optical oscillators but fewer than all of the N optical oscillators 212-1 to 212-N, or all of the N optical oscillators 212-1 to 212-N. However, the second set of the N optical oscillators 212-1 to 212-N does not include the same optical oscillator or optical oscillators as the first set. For example, if the first set of optical oscillators includes all of the N optical oscillators 212-1 to 212-N, the second set includes fewer than all of the N optical oscillators 212-1 to 212-N. If the first set of optical oscillators includes one of the optical oscillators 212-1 to 212-N, then the second set of optical oscillators may be only a different one of the optical oscillators 212-1 to 212-N or the second set of optical oscillators may be a plurality of optical oscillators that does or does not include the optical oscillator used in the first set.

The control system 250 controls one or more of the spectral adjustment apparatuses 295-1 to 295-N to increase the uniformity of the spectral property of the output light beam 211 over time (430). Continuing with the above example in which N is two and the optical source 210 includes the optical oscillator 212-1 as the first set and the optical oscillator 212-2 as the second set, during the first time period, only the light beam 216-1 reaches the beam combiner 218. The light beam 216-2 is produced, but does not reach the beam combiner 218. The spectral bandwidth of the light beam 216-2 is measured by the spectral analysis apparatus 298-2, and data representing the spectral bandwidth of the light beam 216-2 is provided to the control system 250. The control system 250 compares the spectral bandwidth of the light beam 216-2 to a measured or known spectral bandwidth of the light beam 216-1 or to a specification. If the spectral bandwidth of the light beam 216-2 is less than the spectral bandwidth of the light beam 216-1 and/or is less than the specification, the control system 250 controls the spectral adjustment apparatus 295-2 to increase the spectral bandwidth of the second light beam 216-2.

For example, the spectral adjustment apparatus 295-2 may be the spectral adjustment apparatus 395-1 as shown in FIG. 3. In this example, the control system 250 adjusts the spectral properties of the light beam 216-2 by controlling the orientation of the grating 321 and/or one or more of the prisms 322, 323, 324, 325 via the respective actuators 321A, 322A, 323A, 324A, 325A (as shown in FIG. 3).

The spectral property or spectral properties of the light beam 216-2 are adjusted before the second time period starts. Thus, when the control system 250 acts on the beam control apparatus 217 to allow the light beam 216-2 to interact with the beam combiner 218, the spectral property of the light beam 216-2 has already been adjusted. In this way, the control system 250 mitigates or eliminates a sudden change in the spectral property of the output light beam 211, thereby increasing the uniformity of the output light beam 211 even though different ones of the optical oscillators 212-1 to 212-N are used in the first and second time periods.

The first and second time periods are provided as examples. The control system 250 may continue to alternate between using the first optical oscillator 212-1 and the second optical oscillator 212-2 for more than two time periods. Moreover, the first and second sets each having just one optical oscillator is provided as an example. The control system 250 may cycle through more than two sets of the N optical oscillators. For example, N may be six (6). The control system 250 may cause three of the six optical oscillators to reach the beam combiner 218 in the first time period, the other three of the six optical oscillators to reach the beam combiner 218 in the second time period, and any group of three other oscillators to reach the beam combiner 218 in a third time period.

Figure 5:
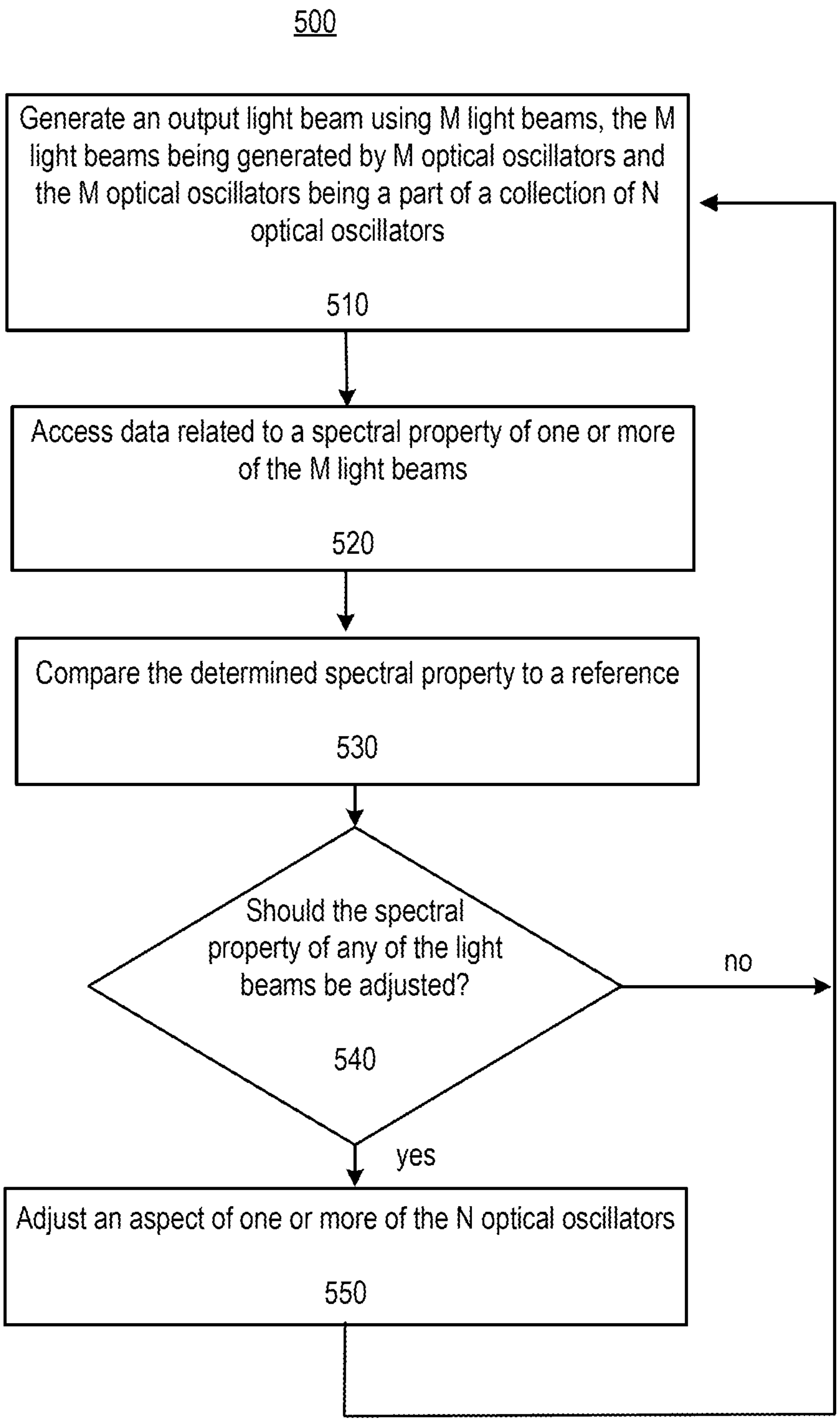
FIG. 5 is a flow chart of an example of a process for adjusting an aspect of one or more optical oscillators in an optical source system.

Referring to FIG. 5, a flow chart of a procedure 500 is shown. The procedure 500 may be performed by the control system 150 (FIG. 1) or the control system 250 (FIG. 2A). In the example below, the procedure 500 is performed by the control system 250 and by the optical source 210. The procedure 500 is used to adjust a spectral property of one or more light beams 216-1 to 216-N. The optical source 210 includes the N optical oscillators 212-1 to 212-N. In the discussion below, the N optical oscillators include a first set of M optical oscillators 212-1 to 212-M and a second set of L optical oscillators 212-1 to 212-L. M and L are integer numbers that are greater than zero and equal to or less than N. The first set and the second set do not include the same optical oscillators. The first set of M optical oscillators is used to generate the output light beam 211 in a first time period. The second set of L optical oscillators is used to generate the output light beam 211 in a second time period.

The procedure 500 may be used to adjust the spectral properties of the light beams 216-1 to 216-L and/or the light beams 216-1 to 216-M such that the spectral property of all light beams 216-1 to 216-N are more similar to each other or are substantially the same, or are closer to a specification. For example, the procedure 500 may be used to make the spectral bandwidth of all of the light beams 216-1 to 216-N equal to the maximum spectral bandwidth possible for optical output produced by the respective optical oscillators 212-1 to 212-N.

During a first time period, the output light beam 211 is generated based on light from M of the optical oscillators 212-1 to 212-M (510). Data related to a spectral property of one or more of the M light beams is accessed (520). For example, the accessed data may be data from the spectral analysis apparatus 298-1 to 298-M. In some implementations, the accessed data may be data from the spectral analysis apparatus 298-1 to 298-M that is stored on the electronic storage 252. The determined spectral property of each of the M light beams is compared to a reference (530). Whether or not to control an aspect of any of the N optical oscillators is determined based on the comparison (540). When an aspect is to be controlled, the control system 250 adjusts one or more of the M optical oscillators to adjust the spectral property of a respective one or more of the M light beams (550).

Various implementations are discussed below using an example in which N is four (4), M is two (2), and L is two (2). The optical source 210 includes four (4) optical oscillators 212-1 to 212-4. The first set includes the optical oscillators 212-1 and 212-2. The second set includes the optical oscillators 212-3 and 212-4.

In some implementations, the reference is a pre-determined value that represents a maximum spectral bandwidth. In these implementations, the reference is stored on the electronic storage 252. The reference may be stored on the electronic storage 252 when the optical system 210 is manufactured or may be loaded onto the electronic storage 252 while the optical source 210 is in the field. The spectral property of each of the M light beams 216-1 and 216-2 is determined based on data from the spectral analysis apparatuses 298-1 and 298-2, respectively, or measured directly using the spectral analysis apparatuses 298-1 and 298-2. The spectral property of each of the light beams 216-1 and 216-2 is compared to the maximum spectral bandwidth. For example, the comparison may be performed by determining a difference between the maximum spectral bandwidth and the spectral property of each of the light beams 216-1 and 216-2. The determined differences may be compared to a threshold. If the difference for the light beam 216-1 is greater than the threshold, then the control system 250 actuates the spectral adjustment apparatus 295-1 to increase the spectral bandwidth of the light beam 216-1. For example, the spectral adjustment apparatus 295-1 may be implemented as shown in FIG. 3. To increase the spectral bandwidth of the light beam 216-1, the control system 250 actuates the prism 324 using the actuator 324A.

One approach to increasing the spectral bandwidth of the light beam 216-1 is to increase a divergence of the light impinging on a grating in the spectral adjustment apparatus 295-1. Another approach is to rapidly vary an angle of incidence of the light impinging on a grating in the spectral adjustment apparatus 295-1. This rapid variation could be executed, for example as discussed below, by applying a suitable time-varying signal to an actuator for a steering prism in the spectral adjustment apparatus 295-1. The speed at which the spectral adjustment apparatus 295-1 is adjusted may be, for example, at least a tenth of the repetition rate of the light beam 216-1 such that the spectral adjustment apparatus 295-1 is adjusted and thereby adjusts the spectral property of the light beam 216-1 every tenth pulse. For example, if the repetition rate of the light beam 216-1 is 6,000 Hz, the spectral adjustment apparatus 295-1 is adjusted at a rate of at least 600 Hz. In this example, the actuator on a steering prism used as discussed above would be actuated at a rate of at least 600 Hz. Other adjustment rates may be used. For example, the spectral adjustment apparatus 295-1 may be adjusted for each pulse produced by the optical oscillator 212-1 (that is, on a pulse-to-pulse basis). In another example, an optical element (such as a steering prism) in the spectral adjustment apparatus 295-1 may be actuated at a rate that adjusts the spectral property of the light beam 216-1 every fifth pulse.

If the difference for the light beam 216-1 is less than the threshold, then the control system 250 does not adjust the spectral bandwidth of the light beam 216-1. A similar analysis is performed for the light beam 216-2.

The above example relates to the reference being a pre-defined or target value such that the spectral property of one or more of the light beams 216-1 to 216-N is compared to the pre-determined value. Other implementations are possible. For example, the spectral property of a light beam in the first set may be compared to a spectral property of a light beam in the second set, or the spectral property of one light beam in the first set may be compared to the spectral property of another light beam in the first set.

To provide a more specific example, the reference may include a value that represents the spectral bandwidth of each of the light beams 216-3 and 216-4. The spectral bandwidth of each light beam 216-1 and 216-2 is compared to the spectral property of the light beam 216-3 and/or the light beam 216-4. For example, the comparison may be performed by determining a difference between the spectral bandwidths of the light beams 216-1 and 216-3. If the spectral bandwidth of the light beam 216-1 is less than the spectral bandwidth of the light beam 216-3, the control system 250 actuates the spectral adjustment apparatus 295-1 to increase the spectral bandwidth of the light beam 216-1. If the spectral bandwidth of the light beam 216-3 is less than the spectral bandwidth of the light beam 216-1, then the control system 250 actuates the spectral adjustment apparatus 295-3 to increase the spectral bandwidth of the light beam 216-3. For example, the spectral adjustment apparatuses 295-1 to 295-4 may be implemented as shown in FIG. 3. In these implementations, to increase the bandwidth of the light beam 216-1, the control system 250 actuates the prism 324 by controlling the actuator 324A of the spectral adjustment apparatus 295-1.

Moreover, the control system 250 may determine an amount of actuation of the prism 324 based on the difference between the spectral bandwidth of the light beam 216-1 and the spectral bandwidth of the light beam 216-3. For example, the actuator 324A may be a piezoelectric actuator that changes shape in response to application of a voltage signal. The prism 324 moves when the piezoelectric actuator changes shape. The amount and direction of movement of the prism 324 is determined by the characteristics of the applied voltage signal. The prism 324 may be moved rapidly by applying a time-varying voltage signal. The amplitude of the applied voltage signal determines the displacement of the prism 324 and the frequency of the applied voltage signal determines how rapidly the prism 324 is displaced. The amplitude of the applied voltage signal is based on the magnitude of the difference, with the amplitude being larger for a larger difference than for a smaller difference. The time-varying signal may be, for example, a sinusoidal or nearly sinusoidal signal, a square wave, a triangle wave, or any other time-varying signal. This scenario is provided as an example. However, similar analysis may be performed to compare the spectral properties of others of the light beams. For example, the spectral properties of each of the light beams 216-3 and 216-4 may be compared to the spectral property of the light beam 216-1 and/or 216-2 and adjustments are made as appropriate. Moreover, the spectral property of the light beam 216-1 may be compared to the spectral property of the light beam 216-2 and adjustments are made as appropriate.

Other aspects of the invention are set out in the following numbered clauses.

1. A system comprising:
 an optical source comprising a plurality of optical oscillators, wherein each optical oscillator is configured to produce a light beam;
 a spectral analysis apparatus; and
 a controller configured to:
 determine, based on data from the spectral analysis apparatus, whether the spectral property of the light beam of a first one of the optical oscillators is different than the spectral property of the light beam of at least one other of the plurality of optical oscillators; and
 if the spectral property of the light beam of the first one of the optical oscillators is different than the spectral property of the light beam of at least one other of the optical oscillators, the controller is configured to adjust the spectral property of the light beam of the first one of the optical oscillators or the spectral property of the light beam of at least one other of the optical oscillators.
2. The system of clause 1, wherein the spectral property comprises a spectral bandwidth.
3. The system of clause 2, wherein the control system being configured to determine whether the spectral bandwidth of the light beam of a first one of the optical oscillators is different from the spectral bandwidth of the light beam of at least one other of the optical oscillators comprises the controller being configured to determine whether the spectral bandwidth of the light beam of the first one of the optical oscillators is less than the bandwidth of the at least one other of the plurality of optical oscillators.
4. The system of clause 3, wherein if the spectral bandwidth of the light beam of the first one of the optical oscillators is less than the spectral bandwidth of the light beam of at least one other of the optical oscillators, the controller is configured to increase the bandwidth of the light beam of the first one of the optical oscillators.

5. The system of clause 1, further comprising a plurality of spectral adjustment apparatuses, wherein each optical oscillator is associated with one of the plurality of spectral adjustment apparatuses, and wherein the controller is configured to control the spectral adjustment apparatus associated with any of the optical oscillators to thereby adjust the spectral property of the light beam of any of the optical oscillators.

6. The system of clause 1, wherein each spectral adjustment system comprises at least one optical element, and the controller is configured to control a particular spectral adjustment apparatus by actuating an actuator coupled to the optical element of that spectral adjustment apparatus such that optical element moves.

7. The system of clause 6, wherein moving the optical element changes a center wavelength of the light beam.

8. The system of clause 6, wherein the controller is further configured to determine an amount of actuation.

9. The system of clause 8, wherein, to actuate the optical element, the controller provides an electrical signal to the optical element, the amount of actuation is based on the electrical signal, and one or more properties of the electrical signal are determined based on the difference.

10. The system of clause 9, wherein the one or more properties of the electrical signal comprise an amplitude and/or a frequency.

11. The system of clause 8, wherein the amount of actuation is based on a number of light pulses expected to interact with the spectral adjustment system over a period of time, and the amount of actuation is a number of separate actuations performed over the period of time.

12. The system of clause 8, wherein the amount of actuation is based on a difference between the spectral property of the light beam of the first one of the optical oscillators and the spectral property of the light beam of the at least one of the other optical oscillators.

13. The system of clause 1, wherein each spectral adjustment apparatus comprises at least one refractive optical element.

14. The system of clause 1, wherein each spectral adjustment apparatus comprises at least one prism.

15. The system of clause 1, wherein each spectral adjustment apparatus comprises a reflective optical element.

16. The system of clause 1, wherein each spectral adjustment apparatus comprises a plurality of prisms and an actuator coupled to one of the prisms, and the controller is configured to adjust the spectral property of the light beam of any of the optical oscillators by controlling the actuator of the respective spectral adjustment assembly to thereby move the one of the prisms.

17. The system of clause 1, wherein the each optical oscillator is configured to emit a pulsed light beam that comprises a plurality of optical pulses.

18. The system of clause 1, wherein the controller is further configured to: determine an updated spectral property of the light beam of the first optical oscillator after adjusting the spectral property, and determine whether the updated spectral property of the light beam of the first optical oscillator is different than the spectral property of the light beam of any of the other of the optical oscillators.

19. The system of clause 1, wherein the plurality of optical oscillators comprises only a first optical oscillator and a second optical oscillator such that the first one of the optical oscillators is the first optical oscillator and the second optical oscillator is the at least one other optical oscillator, and the controller is configured to:

determine, based on data from the spectral analysis system, whether the spectral property of the light beam of first optical oscillator is different than the spectral property of the second optical oscillator; and if the spectral bandwidth of the first optical oscillator is different than the spectral bandwidth of the second optical oscillator, adjust the spectral property of the light beam of the first optical oscillator or the spectral property of the light beam of the second optical oscillator.

20. The system of clause 1, wherein the spectral analysis system comprises a plurality of spectral analysis systems, and each spectral analysis system is configured to receive the light beam of one of the optical oscillators, and each spectral analysis system is configured to measure a spectral property associated with the light beam of the one of the optical oscillators.

21. The system of clause 1, wherein each optical oscillator is configured to contain a gaseous gain medium.

22. The system of clause 21, wherein the gaseous gain medium comprises krypton fluoride (KrF).

23. The system of clause 21, wherein, if the spectral property of the light beam of the first one of the optical oscillators is different than the spectral property of the light beam of at least one other of the optical oscillators, the controller is configured to adjust the pressure and/or concentration of one or more gas components of the gaseous gain medium of the first one of the optical oscillators to adjust the spectral property of the light beam of the first one of the optical oscillators, or adjust the pressure and/or concentration of one or more gas components of the gaseous gain medium of at least one other of the optical oscillators to adjust the spectral property of the at least one other of the optical oscillators.

24. The system of clause 1, further comprising a beam combiner, the beam combiner configured to: receive the light beam of all of the optical oscillators, and direct the light beams toward a DUV lithography scanner tool.

25. The system of clause 1, wherein each optical oscillator is configured to produce a pulsed light beam having a repetition rate, and the controller is configured to adjust the spectral property of the light beam of the first one of the optical oscillators or the second one of the optical oscillators at an adjustment rate, the adjustment rate being equal to or greater than a tenth of the repetition rate.

26. A method for controlling a deep ultraviolet (DUV) light source comprising N optical oscillators, wherein N is an integer number greater than one and each optical oscillator is configured to produce a respective light beam, the method comprising:

forming an output light beam based on M light beams produced by M respective optical oscillators, wherein M is an integer number that is greater than zero and is less than or equal to N;

accessing data related to a spectral property of each of the M light beams;

comparing a spectral property of each of the M light beams to a reference; and determining, based on the comparison, whether to control an aspect of any of the N optical oscillators to thereby adjust the spectral property of any of the N light beams.

27. The method of clause 26, wherein the spectral property comprises a spectral bandwidth.
28. The method of clause 26, wherein the reference comprises a spectral property of all of the M light beams such that comparing the spectral property of each of the M light beams to the reference comprises comparing the spectral property of each of the M light beams to the spectral property of all of the other M light beams.
29. The method of clause 26, wherein comparing the spectral property of each of the M light beams to the spectral property of all of the other M light beams comprises determining a difference between the spectral property of each of the M light beams and the spectral property of each of the other M light beams; and determining, based on the comparison, comprises comparing each determined difference to a specification.
30. The method of clause 26, wherein the reference comprises a pre-determined value of the spectral property, and comparing the spectral property of each of the M light beams to the reference comprises comparing the spectral property of each of the M light beams to the pre-determined value.
31. The method of clause 30, wherein the pre-determined value comprises a maximum spectral bandwidth, and the spectral property of each of the M light beams is compared to the maximum spectral bandwidth by determining a difference between the spectral property of that light beam and the maximum spectral bandwidth.
32. The method of clause 31, wherein determining based on the comparison comprises comparing the determined differences to a pre-determined acceptable difference range, and, for any of the M light beams having a determined difference that is outside of the pre-determined acceptable difference range, an aspect of the respective optical oscillator is controlled.
33. The method of clause 32, wherein controlling an aspect of the respective optical oscillator comprises actuating a dispersive optical element.
34. The method of clause 26, wherein the output light beam is based on the M light beams in a first time period, and based on L light beams in a second time period, L is an integer that is one or greater and is less than or equal to N, and wherein the reference comprises a spectral property of each of the L light beams, and comparing the spectral property of each of the M light beams to the reference comprises comparing the spectral property of each of the M light beams to the spectral property of each of the L light beams.
35. The method of clause 34, wherein L is one, M is one, N is two, the L light beam is a first light beam generated by a first one of the N optical oscillators, and M light beam is a second light beam generated by a second one of the N optical oscillators; and wherein comparing the spectral property of the first light beam and the spectral property of the second light beam comprises determining whether the spectral bandwidth of the second light beam is less than the spectral band width of the first light beam; and if the spectral bandwidth of the second light beam is less than the spectral bandwidth of the first light beam, controlling a prism in the second one of the N optical oscillators such that the spectral bandwidth of the second light beam is increased.
36. The method of clause 34, wherein L is one, M is one, N is two, the L light beam is a first light beam generated by a first one of the N optical oscillators, and M light beam is a second light beam generated by a second one of the N optical oscillators; and wherein comparing the spectral property of the first light beam and the spectral property of the second light beam comprises determining whether the spectral bandwidth of the first light beam is less than the spectral band width of the second light beam; and if the spectral bandwidth of the first light beam is less than the spectral bandwidth of the second light beam, controlling a prism in the first one of the N optical oscillators such that the spectral bandwidth of the first light beam is increased.
37. The method of clause 35, further comprising: determining an amount of adjustment to the prism in the second one of the N optical oscillators based on a difference between the spectral bandwidth of the first light beam and the spectral bandwidth of the second light beam.
38. The method of clause 37, wherein to control the prism in the second one of the N optical oscillators, a time-varying signal is applied to an actuator physically coupled to the prism, the amplitude of the time-varying signal being related to the difference between the spectral bandwidth of the first light beam and the spectral bandwidth of the second light beam.
39. A control system for a deep ultraviolet (DUV) light source comprising N optical oscillators, wherein N is an integer number greater than one and each optical oscillator is configured to produce a respective light beam, the control system configured to:

control a first set of the N optical oscillators to generate a first set of light beams during a first time period such that an output light beam produced by the DUV light source during the first time period comprises the first set of light beams;

control a second set of the N optical oscillators to generate a second set of light beams during a second time period such that the output light beam produced by the DUV light source during the second time period comprises the second set of light beams, wherein the second set of the N optical oscillators and the first set of N optical oscillators do not comprise the same one or ones of the N optical oscillators; and control a spectral adjustment apparatus of at least one of the N optical oscillators to increase uniformity of a spectral property of the N light beams.
40. The control system of clause 39, wherein the spectral adjustment apparatus is controlled before the second time period.
41. The control system of clause 40, wherein the spectral adjustment apparatus of one or more of the N optical oscillators in the second set of the N optical oscillators is controlled to adjust the spectral property of one or more of the respective second set of light beams.
42. The control system of clause 39, wherein each optical oscillator is configured to produce a respective pulsed light beam at a repetition rate, and the control system is configured to control the spectral adjustment apparatus of at least one of the N optical oscillators at an adjustment rate that is greater than or equal to a tenth of the repetition rate.

Other implementations may be within the scope of the claims.

What is claimed is:

1. A system comprising:

an optical source comprising a plurality of optical oscillators, wherein each optical oscillator is configured to produce a light beam and one or more of the produced light beams contribute to an output light beam at any given time;

a plurality of spectral adjustment apparatuses, each optical oscillator associated with one of the spectral adjustment apparatuses;

a spectral analysis apparatus; and a controller configured to:

determine, based on data from the spectral analysis apparatus, whether a spectral bandwidth of the light beam of a first one of the optical oscillators is different than a spectral bandwidth of the light beam of at least one other of the plurality of optical oscillators;

if the spectral bandwidth of the light beam of the first one of the optical oscillators is less than the spectral bandwidth of the light beam of at least one other of the optical oscillators, the controller is configured to adjust the spectral bandwidth of the light beam of the first one of the optical oscillators including determining an amount of actuation to an actuator coupled to an optical element of the spectral adjustment apparatus associated with the first one of the optical oscillators, the amount of actuation being based on a difference between the spectral bandwidth of the light beam of the first one of the optical oscillators and the spectral bandwidth of the light beam of the at least one of the other optical oscillators;

wherein the controller is configured to adjust the spectral bandwidth of the light beam of the first one of the optical oscillators by instructing the actuator coupled to the optical element of the spectral adjustment apparatus associated with the first one of the optical oscillators to rapidly move the optical element to thereby vary a center wavelength of the light beam and increase the spectral bandwidth of the light beam of the first one of the optical oscillators.

2. The system of claim 1, wherein the controller is configured to control the spectral adjustment apparatus associated with any of the optical oscillators to thereby adjust the spectral bandwidth of the light beam of any of the optical oscillators.

3. The system of claim 2, wherein each spectral adjustment apparatus comprises at least one optical element, and the controller is configured to control a particular spectral adjustment apparatus by actuating an actuator coupled to the optical element of that spectral adjustment apparatus such that optical element moves, and moving the optical element changes the center wavelength of the light beam.

4. The system of claim 3, wherein the controller is further configured to determine an amount of actuation.

5. The system of claim 4, wherein the amount of actuation is based on a number of light pulses expected to interact with the spectral adjustment apparatus over a period of time, and the amount of actuation is a number of separate actuations performed over the period of time.

6. The system of claim 4, wherein the controller is configured to instruct the actuator coupled to the optical element by providing an electrical signal to the optical element, the amount of actuation is based on the electrical signal, and one or more of an amplitude and a frequency of the electrical signal are determined based on the difference.

7. The system of claim 1, further comprising a plurality of spectral adjustment apparatuses, and wherein each spectral adjustment apparatus comprises at least one prism.

8. The system of claim 1, wherein each spectral adjustment apparatus comprises a reflective optical element.

9. The system of claim 1, wherein each spectral adjustment apparatus comprises a plurality of prisms and an actuator coupled to one of the prisms, and the controller is configured to adjust the spectral bandwidth of the light beam of any of the optical oscillators by controlling the actuator of the respective spectral adjustment apparatus to thereby move the one of the prisms.

10. The system of claim 1, wherein the plurality of optical oscillators comprises only a first optical oscillator and a second optical oscillator such that the first one of the optical oscillators is the first optical oscillator and the second optical oscillator is the at least one other optical oscillator, and the controller is configured to:

determine, based on data from the spectral analysis apparatus, whether the spectral bandwidth of the light beam of first optical oscillator is different than the spectral bandwidth of the second optical oscillator; and if the spectral bandwidth of the first optical oscillator is different than the spectral bandwidth of the second optical oscillator, adjust the spectral bandwidth of the light beam of the first optical oscillator or the spectral bandwidth of the light beam of the second optical oscillator.

11. The system of claim 1, wherein each optical oscillator is configured to contain a gaseous gain medium.

12. The system of claim 11, wherein, if the spectral bandwidth of the light beam of the first one of the optical oscillators is different than the spectral bandwidth of the light beam of at least one other of the optical oscillators, the controller is configured to adjust the pressure and/or concentration of one or more gas components of the gaseous gain medium of the first one of the optical oscillators to adjust the spectral bandwidth of the light beam of the first one of the optical oscillators, or adjust the pressure and/or concentration of one or more gas components of the gaseous gain medium of at least one other of the optical oscillators to adjust the spectral bandwidth of the at least one other of the optical oscillators.

13. The system of claim 1, wherein each optical oscillator is configured to produce a pulsed light beam having a repetition rate, and the controller is configured to instruct the optical source to rapidly vary the center wavelength of the light beam of the first one of the optical oscillators or a second one of the optical oscillators at an adjustment rate, the adjustment rate being equal to or greater than a tenth of the repetition rate.

14. The system of claim 1, further comprising a beam combiner configured to receive the light beam of all of the optical oscillators, and direct the light beams toward a DUV lithography scanner tool.

15. A method for controlling a deep ultraviolet (DUV) light source comprising first and second optical oscillators, wherein the first optical oscillator is configured to produce a first light beam and the second optical oscillator is configured to produce a second light beam, the method comprising:

during a first time period, forming an output light beam from the first light beam;

accessing data related to a spectral bandwidth of each of the first and second light beams;

comparing a spectral bandwidth of the first light beam to a spectral bandwidth of the second light beam;

determining, based on the comparison, whether the spectral bandwidth of the second light beam is different from the spectral bandwidth of the first light beam; and if to the spectral bandwidth of the second light beam is less than the spectral bandwidth of the first light beam, then instructing the second optical oscillator to adjust the spectral bandwidth of the second light beam prior to a start of a second time period that follows the first time period by instructing the second optical oscillator to rapidly vary a center wavelength of the second light beam, the instruction being based on a difference between the spectral bandwidth of the first light beam and a spectral bandwidth of the second light beam.

16. The method of claim 15, further comprising, during the second time period, forming the output light beam from the second light beam.

17. The method of claim 16, wherein instructing the second optical oscillator to rapidly vary the center wavelength of the second light beam comprises instructing an actuator associated with a prism in a path of the second light beam to rapidly vary an angle of the prism.

18. The method of claim 17, wherein instructing the actuator associated with the prism in the path of the second light beam to rapidly vary the angle of the prism comprises applying a time-varying signal to the actuator physically coupled to the prism, the amplitude of the time-varying signal being related to the difference between the spectral bandwidth of the first light beam and the spectral bandwidth of the second light beam.

19. The method of claim 15, wherein rapidly varying the center wavelength of the second light beam comprises rapidly actuating a dispersive optical element that interacts with the second light beam to thereby rapidly change an angle of incidence at which the second light beam impinges upon a surface of a grating.

20. A control system for a deep ultraviolet (DUV) light source comprising first and second optical oscillators, wherein the first optical oscillator is configured to produce first light beam and the second optical oscillator is configured to produce a second light beam, the control system configured to:

during a first time period, forming an output light beam from the first light beam;

during a second time period that follows the first time period, forming the output light beam from the second light beam;

prior to the start of the second time period: access data related to a spectral bandwidth of each of the first and second light beams, determine whether the spectral bandwidth of the second light beam is different from the spectral bandwidth of the first light beam, and, if the spectral bandwidth of the second light beam is less than the spectral bandwidth of the first light beam, control, based on the determined difference, a spectral adjustment apparatus of the second optical oscillator including rapidly varying a center wavelength of the second light beam generated by the second optical oscillator to increase the spectral bandwidth of the second light beam.

21. The control system of claim 20, wherein the second optical oscillator is configured to produce the second light beam as a pulsed second light beam at a second repetition rate, and the control system is configured to control the spectral adjustment apparatus of the second optical oscillator including rapidly varying the center wavelength of the second light beam generated at an adjustment rate that is greater than or equal to a tenth of the second repetition rate.

* * * * *